United States Patent [19]

Elsässer et al.

[11] Patent Number: 4,686,464
[45] Date of Patent: Aug. 11, 1987

[54] BUCKLING BEAM TEST PROBE ASSEMBLY

[75] Inventors: Michael Elsässer, Herrenberg; Roland Stöhr, Nufrigen, both of Fed. Rep. of Germany

[73] Assignee: International Business Machines Corporation, Armonk, N.Y.

[21] Appl. No.: 740,772

[22] Filed: Jun. 3, 1985

[30] Foreign Application Priority Data

Jun. 22, 1984 [EP] European Pat. Off. ........ 84107154.1

[51] Int. Cl.⁴ .................... G01R 1/06; G01R 31/02
[52] U.S. Cl. ............................ 324/158 P; 324/72.5; 324/158 F
[58] Field of Search .............. 324/158 P, 158 F, 72.5, 324/73 PC

[56] References Cited

U.S. PATENT DOCUMENTS 3,806,801 4/1974 Bove .................................. 324/72.5
4,063,172 12/1977 Faure et al. ..................... 324/158 P

FOREIGN PATENT DOCUMENTS 0068493 1/1983 European Pat. Off. ........ 324/158 P

OTHER PUBLICATIONS

Bruder et al.; "Dual Beam . . . "; IBM Tech. Dis. Bull.; vol. 17; No. 2; Jul. 1974; pp. 638-639.

*Primary Examiner*—Ernest F. Karlsen
*Attorney, Agent, or Firm*—John D. Crane; John A. Jordan

[57] ABSTRACT

The buckling beam probe contactor assembly comprises a number of square test probe arrays each containing a plurality of buckling beams in the form of continuous wires extending from the probe tips to a remote test apparatus. The buckling beams pass through an adjustable beam carrier block and through a number of guide plates which are kept in predetermined distances along the buckling beams by means of thin stabilizing rods arranged at the corners of the test probe array. The guide plates are inserted into grid-like frames which allow the arrangement of a plurality of test probe arrays close to each other wherein each array may contain test probes over its full area except for the locations occupied by the thin stabilizing rods.

14 Claims, 7 Drawing Figures

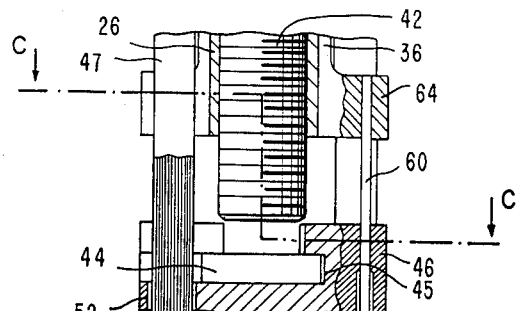
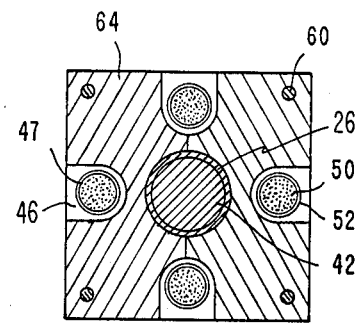
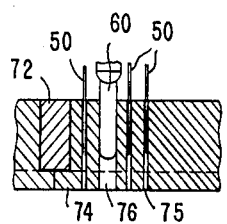
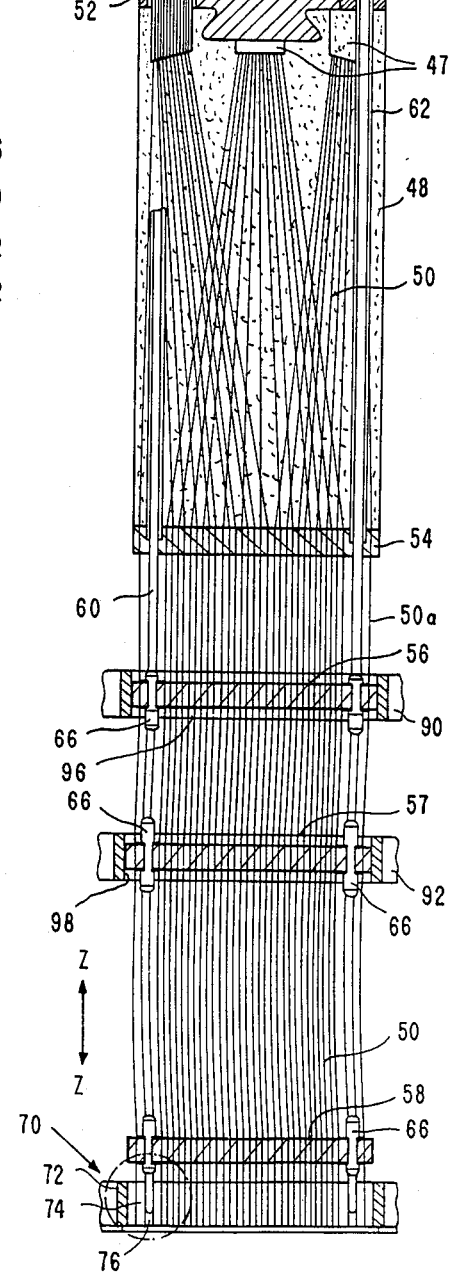
FIG. 5
FIG. 6
FIG. 4

BUCKLING BEAM TEST PROBE ASSEMBLY

BACKGROUND OF THE INVENTION

This invention relates to a buckling beam test probe assembly, including a plurality of probe wire arrays each of which is adapted to a pattern of test pads of a microelectronic circuit.

Buckling beam probe contactors have been utilized for testing the electrical characteristics of integrated circuits connected to pads on a semiconductor chip. The probe wires of the probe assembly engage the pads to electrically connect the pads in parallel to the test apparatus. Limited force application is needed to prevent damage to the pads or the microelectronic circuit. Additionally, since the pads are located in close proximity, thin deflectable wires functioning as buckling beams must have their contact tips accurately positioned with respect to the pads to prevent shorts between circuits.

Buckling beam test probe contactors already proposed include a central support post which is designed to carry guide means for a plurality of buckling probe wires. The tips of these wires form a test pattern or array, and a plurality of such test patterns or arrays are arranged closely adjacent to each other to form a test head adapted to contact in parallel the pads of a complex microelectronic circuit. Each array contains a certain area in which there are no wire tips due to the presence of the central support post. Thus, if the pad pattern to be tested includes pads in that specific area, such pads cannot be tested in the same test operation but must be subject to a second test operation utilizing a modified test probe assembly. In this regard, reference is made to the U.S. applications Ser. No. 509,519 filed June 30, 1983, now U.S. Pat. No. 4,518,910, Ser. No. 279,128 filed June 30, 1981, now U.S. Pat. No. 4,506,215 and Ser. No. 278,950 filed June 30, 1981, now U.S. Pat. No. 4,554,506, all assigned to the assignee of the present invention.

It is also known to use a buckling beam test probe assembly which consists of a plurality of test probe wires the tips of which form a matrix (U.S. Pat. No. 3,806,801). These wires are supported by a solid frame which does not allow the arrangement of a plurality of such probe arrays in close proximity to each other.

The invention solves the problem of contacting in one test operation a plurality of closely adjacent test pad patterns of a complex microelectronic circuit where in each pattern the area in which there are no test probe wires due to the presence of wire guide support means is reduced to a minimum.

The buckling beam test probe assembly according to the invention has the advantage of allowing an easy and time-saving mounting of a large plurality of buckling beam arrays arranged in quads each containing, for example, 25 test probe arrays. These arrays are arranged in close proximity to each other and contain very limited areas which are not occupiable by test wire tips in accordance with the pattern of pads being contacted.

BRIEF DESCRIPTION OF THE DRAWINGS

FIG. 4 shows a buckling beam array as enlarged portion of FIG. 3.

FIG. 5 is a cross-section according to line C—C in FIG. 4.

FIG. 6 shows an enlarged stripper plate portion of FIG. 4.

DETAILED DESCRIPTION OF THE PREFERRED EMBODIMENT

Figure 1:
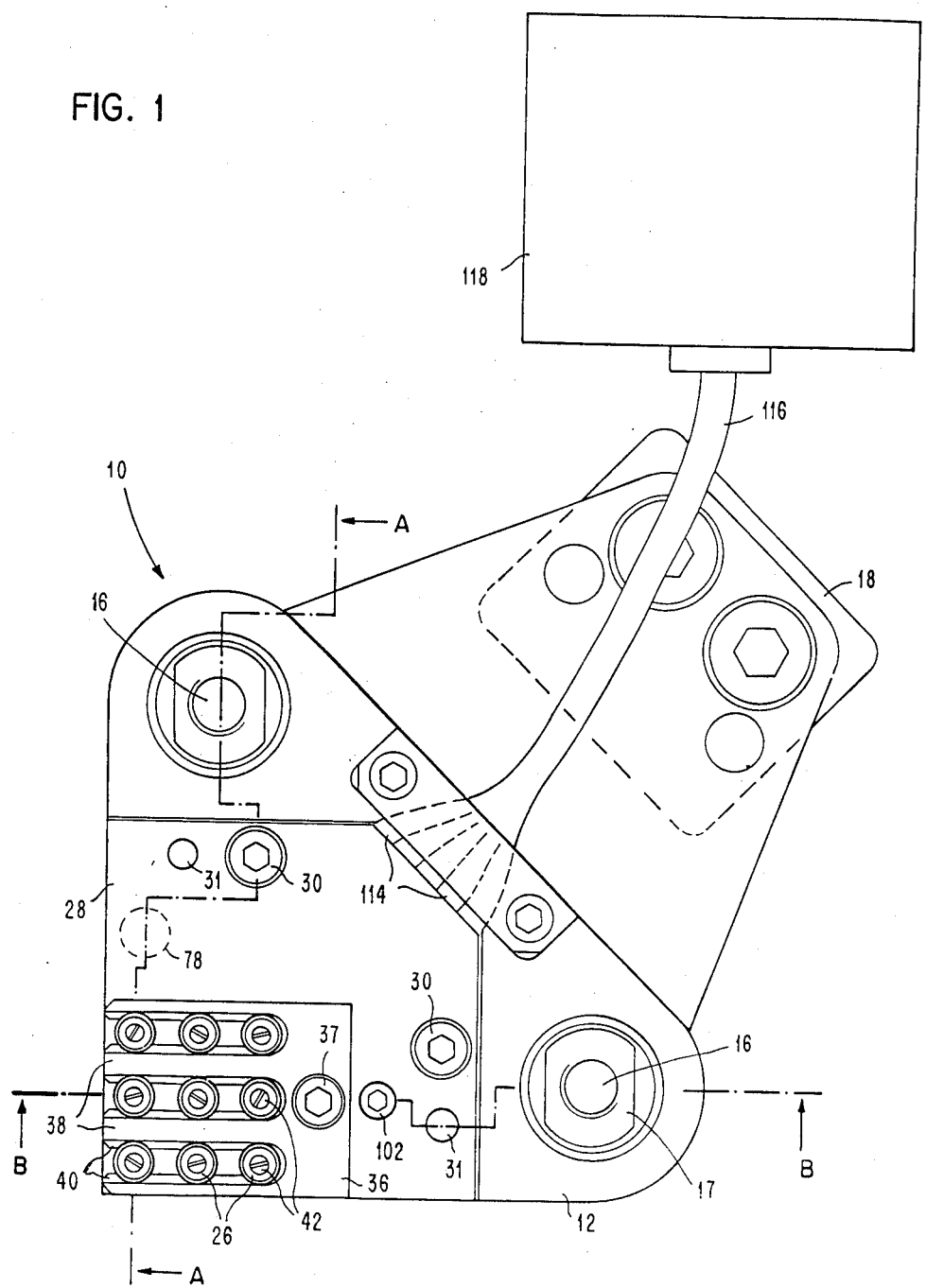
FIG. 1 is a top view of a quad assembly buckling beam probe contactor forming a preferred embodiment of the invention.

Referring to FIG. 1, there is shown a quad of a buckling beam test probe contactor 10 which comprises an assembly block 12 connected to a relatively fixed mount 14 (FIG. 2) by means of two rods 16 extending through holes in both members 12 and 14. Mount 14 is connected to support means 18 which are part of the overall structure of the test contactor equipment. Beneath the mount 14 there is arranged a distance tube 20 and a coil spring 22 concentrically about each of the rods 16. The helical coil spring 22 biases assembly block 12 downwardly and allows its movement relative to mount 14 in the direction Z indicated by arrow 24; the distance of such movement is determined by the length of tube 20.

Elongated tubes 26 are mounted to a plate 28 fixed at the top of assembly block 12 by means of screws 30 and pins 31. Each of the tubes 26 includes a collar 32 and a groove 34 at its upper end. The tubes 26 pass through circular holes within plate 28 at each of the tube locations which are arranged in a square matrix as seen in FIG. 1. A locking plate 36 mounted at the top of plate 28 by screw 37 comprises fingers 38 provided with rails 40 which engage the grooves 34 at the tubes 32 to lock them in their positions.

Each of the tubes 26 includes a screw bolt 42 threaded to the tube to effect vertical raising and lowering of an array of buckling beams 50. For this purpose, the lower end of the screw bolt 42 comprises a rotatable collar 44 which engages a groove 45 in a top portion 46 of a carrier block 48 of a square cross-section (see FIG. 4 and 5). A number of buckling beams 50, each of which consist of an electrically conducting coated wire, are embedded in the carrier block 48. Above the carrier block 48 the buckling beams are bundled into four cables 47 each of which lead to one of four holes 52 in the top portion 46 of the carrier block 48 as shown in FIG. 5. The carrier block 48 includes at its bottom side an exit plate means 54 with a pattern of via holes through which the buckling beams 50 are conducted. This pattern of via holes corresponds to the pattern of test pads of the electronic product to be tested. The same pattern of via holes is included in guide plate means 56, 57, 58 which are arranged beneath the carrier block 48. Guide means 56 and 58 are in vertical alignment to the exit means 54 while guide means 57 has been slightly offset in lateral direction as described subsequently. The position in height of each of the guide plates 56, 57, 58 is determined by four cylindrical rods 60 which pass through holes 62 of the carrier block 48. The holes 62 are arranged at the corners of the square-shaped profile of carrier block 48 and are slightly larger in diameter than the rods 60 to allow a movement of carrier block 48 along the rods 60. The upper end of the rods are rigidly connected to a collar 64 of the tube 26 (FIG. 5). The rods 60 are also rigidly connected to the guide means 56, 57 and 58 by means of swaging 66.

A stripper plate 70 (FIG. 4) is arranged at the lower end of the buckling beams 50. The stripper plate consists of frame means 72 containing a number of square inserts 74 each of which includes the same pattern of via holes 75 (FIG. 6) as the exit means 54, and guide means 56, 57 and 58 (FIG. 4) corresponding to the pattern of pads of the circuit product to be tested. The tips of the buckling beams 50 (FIG. 6) rest within the holes 75 of the insert so that they are completely protected by the latter. The same is true for the rods 60 which rest in holes 76 of the insert 74. If a vertical adjustment movement of the carrier block 48 (FIG. 4) takes place by turning screw bolt 42, the tips of the buckling beams 50 are raised or lowered in the stripper plate insert while rods 60 and guide means 56, 57 and 58 remain in their positions.

Figure 2:
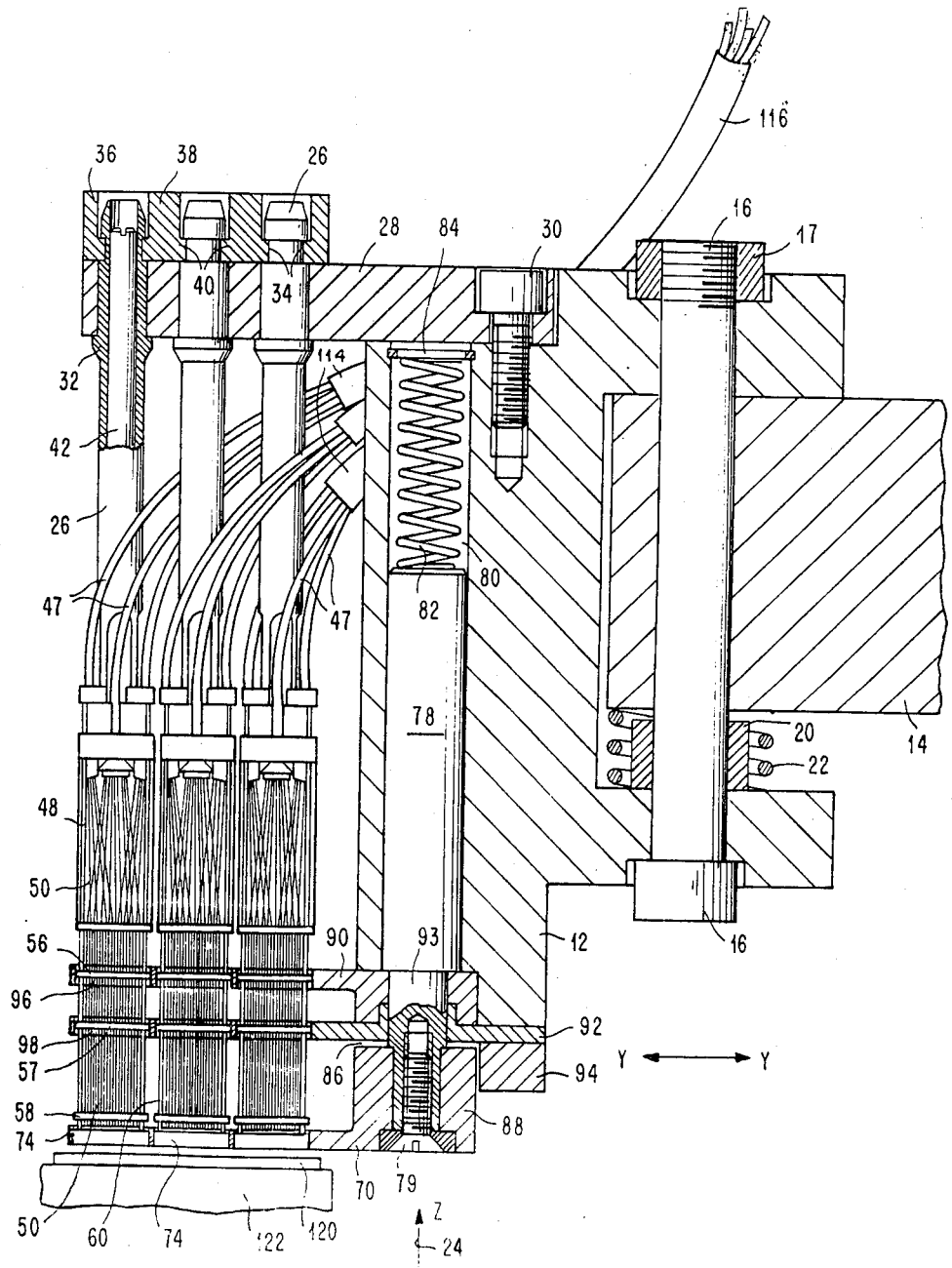
FIG. 2 is a cross-section according to line A—A in FIG. 1.
Figure 7:
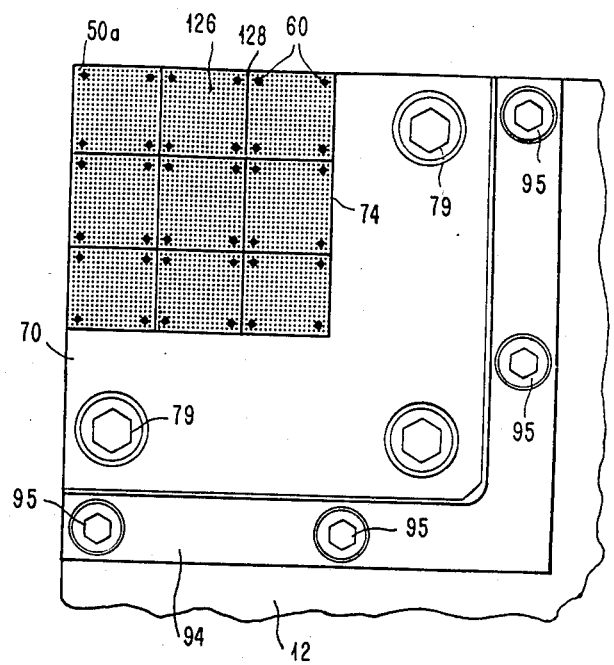
FIG. 7 is a partial view of the probe wire tips in the assembly of FIG. 1 seen from its bottom side.

As shown in FIG. 2 the stripper plate is connected by a screw 79 to a rod 78 guided in a hole 80 of assembly block 12. A helical coil spring 82 is arranged within the hole 80 above the rod 78. The upper end of spring 82 is in contact with a circular disk 84 fixed to the assembly block 12 at the upper end of hole 80. Rod 78 is thus upwardly shiftable and allows a vertical movement of the stripper plate 70 by a distance which is determined by a gap 86 between the upper end of an extension 88 of the stripper plate 70 and the lower one of two frame means 90 and 92. Rod 78 comprises a cylindrical portion 93 of reduced diameter which extends through vertically aligned holes in the frame means 90 and 92. An angular plate 94 which is adjacent to the extension 88 of stripper plate 70 is used to fix frame means 92 and thereby also frame means 90 in their positions relative to assembly block 12 by means of screws 95 (FIG. 7).

Each of the frame means 90 and 92 consists of a grid of nine square holes 96 and 98 adapted to the outer contours of the guide means 56 or 57 respectively. The holes 96 in frame means 90 are closely adjacent to each other to form a square matrix of 3×3 which is in alignment to the equivalent matrix formed by the inserts 74 of the stripper plate 70 as shown in FIG. 7. The latter Figure shows the test head portion of assembly 12 from the bottom side. The square holes 98 of frame means 92 are arranged in the same manner.

Figure 3:
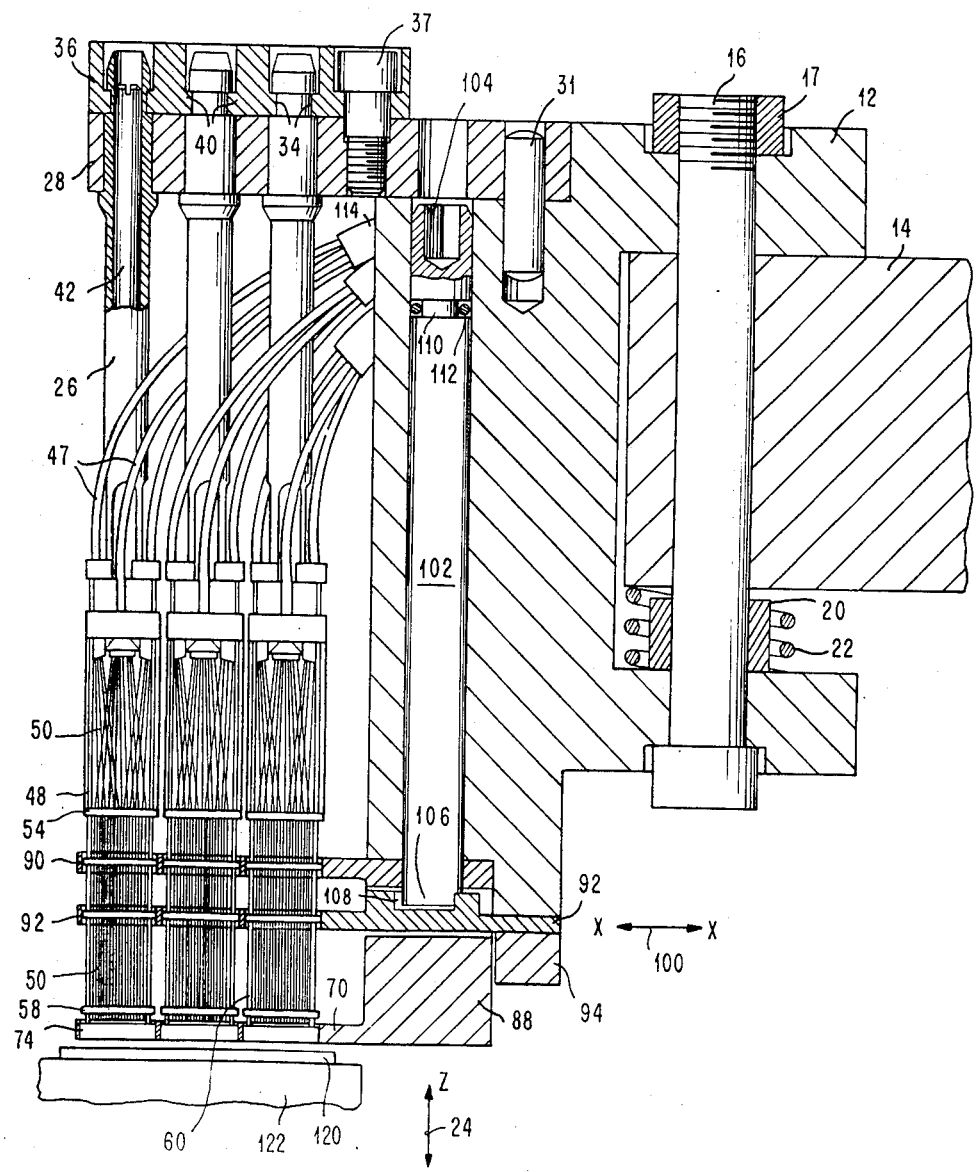
FIG. 3 is a cross-section according to line B—B in FIG. 1.

As shown in FIG. 3, frame means 92 is laterally adjustable in X direction of arrow 100 by means of a cylindrical rod 102 which has at its upper end a hexagon socket 104 and at its lower end an eccentric extension 106 which is cylindric in its cross-section and which engages a cylindrical recess 108 of frame 92. Rod 102 includes a groove 110 containing a locking ring 112 which secures rod 102 in its angular position. Turning rod 102 causes a lateral adjustment of frame 92 in the direction X indicated by arrow 100. By the lateral adjustment of frame means 92 the buckling beams 50 the diameter of which is, for example, about 0.15 mm are in parallel laterally deflected by offsetting the guide means 57 relative to the guide plates 56 and 58 and the exit means 54 (FIG. 3). Rods 60 which are less than 1 mm in diameter participate in the lateral deflection. By fine tuning of rod 102 the buckling beams 50 are deflected in X direction by a predetermined amount to ensure a minimum contact between the individual wires and to adjust the contact force of the buckling beam tips to the pads of the product being tested. An increased lateral deflection of the buckling beams 50 reduces the contact force, while reducing the amount of deflection increases the contact force.

The buckling beams 50 are continuous wires running from stripper plate 70 through the carrier block 48, the cables 47, array cables 114 and an assembly cable 116 to a test apparatus 118 (FIG. 1). Thus continuous wires run from the bottom of the stripper plate 72 all the way to the test apparatus 118 to establish a failure free transfer of the test signals between the test apparatus and the product being tested. While the beam wires may consist of the same material throughout their length, alternatively portions of different materials may be bonded or welded together to form a continuous wire.

FIG. 3 illustrates schematically the product 120 being tested which is supported by a table 122 movable in the direction Z of arrow 24. The pad pattern of product 120 may fully correspond to the pattern constituted by the 3×3 matrix of buckling beam arrays such as 126 (FIG. 7). That matrix is arranged at a rectangular corner of the assembly four of which when arranged in opposition to each other form a probe head.

The pad pattern of the product being tested may form a subset of the buckling beam tip positions. FIG. 7 shows that, except for the small areas which are occupied by the columns 60 and the gaps 128 between the arrays, the whole test head area may be occupied by probe positions each of which is formed by a beam tip. This arrangement allows that in parallel a large number of pads may be contacted for test purposes, and consequently the test time may be reduced considerably. It should be noted that the test probe positions may even be located in the small areas between the rods 60 and the edges of the guide means 56, 57, 58 and stripper plate inserts 74, as shown in FIGS. 4 and 7 by reference number 50a.

As shown in FIG. 2 The beam tips are protected from mechanical damage since they are housed within the stripper plate insert 74 up to their contact with product 120 being tested. The holes in the insert 74 are precisely sized to the diameter of the coated beams 50 and to their position according to the class of pad patterns of the products being tested.

In performing a test operation the table 122 carrying the product being tested is raised to bring product 120 in contact with stripper plate 70 which then is forced upward relative to assembly block 12 against the action of spring 82. During this movement the tips of buckling beams 50 contact the test pads (not shown) of product 120 and the beams deflect a predetermined amount which is defined by gap 86 and which may be about 0.5 mm. When extension 88 contacts frame means 92 terminating distance gap 86, beams 50 continue to be deflected and are in secure contact to the pads of the product being tested. During this operation the beams 50 do not take up the force applied by the stripper plate against the product being tested. Any additional upward movement of product 120 is absorbed by spring 22 which allows an upward movement of assembly block 12 by a distance determined by the gap between distance tube 20 and the bottom surface of mount 14. The buckling beam test probes 50 and the whole contactor 10 is thus protected against excess forces applied to the stripper plate 70 in preparation, during or after the test operation.

During the test operation the grid-like frame means 90 and 92 and the grid-like stripper plate 70 are able to take up forces in X-Y direction which may arise when the buckling beams 50 are contacting in parallel the test pads of product 120. At the same time the rods 60 perform a stabilizing function and keep the guide means 56, 57 and 58 in their positions in Z direction and thus maintaining the resilient resistance characteristics of the buckling beams 50 and their distances between each other.

Each test probe array, such as 126, FIG. 7 may be adjusted in its height by rotating its screw bolt 42 to effect vertical raising or lowering of carrier block 48 and therewith of all beams embedded therein relative to the guide means 56, 57 and 58 and to the inserts 74 of the stripper plate 70. It is thus possible to adjust the height of each probe array, such as 126, relative to all other probe arrays of the probe head shown in FIG. 7 while the positions of the guide means 56, 57 and 58 relative to each other as well as the resilient characteristics of the probe array are maintained.

What is claimed is:

1. A buckling beam test probe assembly comprising a plurality of electrically conductive probe wire arrays wherein each wire is free to buckle in the X-Y direction when a force is applied in the Z direction by contacting a product being tested, and wherein said assembly includes mounting members means suitable to fix said plurality of probe wire arrays in a grid-like structure, said mounting members means comprising;

a plurality of guide means for determining the array position of each buckling beam in said array with each buckling beam slidably arranged in holes of each said guide means, each of said guide means being coupled together by slender stabilizing means fixedly arranged at the periphery of each said guide means for maintaining the position of each said guide means along the Z direction; and at least one frame means having a plurality of openings in which respective ones of said buckling beams are inserted, said openings being arranged in 2 dimensions adjacent to each other so as to allow a densely arranged plurality of arrays of buckling beams, whereby each of said arrays may occupy the full area of the assigned guide means except the positions of the stabilizing means, said frame means being movable in the Z direction by a given amount so as to restrain motion of said buckling beams in the X-Y direction which arises when said beams contact in parallel the product being tested.

2. The test probe assembly according to claim 1 wherein said buckling beams of each array emanate from beam carrier means with each of said beam carrier means having adjusting means rotatably connected to one end thereof to move said beams in the Z direction, whereby the axial position of the buckling beam arrays are adjustable relative to each other and to the surface of the product being tested.

3. Test probe assembly according to claim 2 wherein said buckling beams are continuous wires extending from test apparatus to the end of the beams adjacent to the product being tested and wherein said beam carrier means comprise a moldable and electrically insulating material fixedly embedding therein said buckling beams which pass therethrough from said test apparatus.

4. Test probe assembly according to claim 2 wherein said adjusting means include tube means fixedly arranged and provided with a nut thread and a screw bolt engaging said nut thread, said screw bolt rotatably connected to said beam carrier means so that said beam carrier means follows the movement of said screw bolt in the Z direction when it is rotated.

5. Test probe assembly according to claim 1 further including stripper plate means common to said plurality of buckling beam arrays arranged adjacent to the beam tips and including holes to slidably guide the tips of the beams and to accurately position them according to the position of test pads of the product being tested and slidable guide means connecting said stripper plate means allowing its movement in Z direction by a predetermined distance.

6. Test probe assembly according to claim 5 wherein said at least one frame means include at least one grid-like frame means having square openings which are close to each other and which are adapted to surround a plurality of corresponding guide means through which the buckling beams are guided.

7. Test probe assembly according to claim 6 wherein said beam carrier means, said grid-like frame means and said stripper plate means are seriately located and separated from one another whereby buckling of said beams in the X-Y direction occurs between said beam carrier means and said stripper plate means.

8. Test probe assembly according to claim 7 wherein said grid-like frame means is arranged to allow lateral movement for biasing said beams to buckle in a predetermined direction when a predetermined force in the Z direction is applied.

9. Test probe assembly according to claim 8 wherein rotatable rod means including an eccentric portion engages said grid-like frame means whereby rotation of the rod means causes lateral adjustment of said grid-like frame means.

10. Test probe assembly according to claim 5 wherein said stripper plate means include a stripper plate frame comprising rectangular openings in a grid-like structure, and wherein said openings include stripper plate inserts fixedly arranged therein to align said buckling beams of each array with corresponding ones of said guide means.

11. Test probe assembly according to claim 10 wherein each of said stripper plate inserts includes an individual set of holes guiding the tips of the buckling beams of respective ones of said array of buckling beams and adapted to the pattern of test points of the product being tested.

12. Test probe assembly according to claim 11 wherein said slender stabilizing means are fixedly connected at their upper end to the lower ends of said tube means through collar means, at their intermediate points to said guide means to keep latter in their predetermined positions along the extension of the buckling beams in the Z direction and at their lower ends in holes of the said stripper plate inserts guide means of said stripper plate means.

13. Test probe assembly according to claim 12 wherein said slender stabilizing means slidably pass through holes in said beam carrier means and are fixedly arranged in holes of said guide means.

14. Test probe assembly according to claim 13 wherein said slender stabilizing means are cylindrical rods which jointly deflect with said beams when said frame means is laterally adjusted.

* * * * *